United States Patent
Yoshizawa

(10) Patent No.: US 7,420,408 B2
(45) Date of Patent: Sep. 2, 2008

(54) CURRENT CONTROL CIRCUIT WITH LIMITER, TEMPERATURE CONTROL CIRCUIT, AND BRIGHTNESS CONTROL CIRCUIT

(75) Inventor: Nobukazu Yoshizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 259 days.

(21) Appl. No.: 11/358,126

(22) Filed: Feb. 22, 2006

(65) Prior Publication Data

US 2006/0186868 A1    Aug. 24, 2006

(30) Foreign Application Priority Data

Feb. 23, 2005    (JP)    ............... 2005-046348

(51) Int. Cl.
G05F 3/02    (2006.01)
(52) U.S. Cl. ..................... 327/538; 327/541
(58) Field of Classification Search ............ 327/538, 327/540, 541
See application file for complete search history.

(56) References Cited

U.S. PATENT DOCUMENTS 5,465,039 A * 11/1995 Narita et al. ............. 320/164
5,625,275 A * 4/1997 Tanikawa et al. ............ 320/160
5,698,964 A * 12/1997 Kates et al. ................. 320/164

FOREIGN PATENT DOCUMENTS

JP    5-6929    1/1993

* cited by examiner

Primary Examiner—Kenneth B. Wells
(74) Attorney, Agent, or Firm—McGinn IP Law Group, PLLC

(57) ABSTRACT

A current control circuit with limiter includes a voltage follower as the output unit of the current control circuit, the voltage follower including a transistor, the circuit further including two operational amplifiers and two diodes. In a first operational amplifier, the non-inverting input receives an input voltage to the current control circuit and the inverting input receives the output of the voltage follower. In a second operational amplifier, the non-inverting input receives a predetermined voltage and the inverting input receives the output of the voltage follower. A first diode is connected between the output of the first operational amplifier and the input of the voltage follower. A second diode is connected between the output of the second operational amplifier and the input of the voltage follower.

19 Claims, 15 Drawing Sheets

CURRENT CONTROL CIRCUIT WITH LIMITER, TEMPERATURE CONTROL CIRCUIT, AND BRIGHTNESS CONTROL CIRCUIT

BACKGROUND OF THE INVENTION

1. Field of the Invention

The present invention relates to a current control circuit with limiter, and more particularly, to a current control circuit with limiter for generating a current proportional to an input voltage when the input voltage is smaller than a predetermined voltage and generating a constant current when the input voltage is equal to or higher than the predetermined voltage. The present invention also relates to a temperature control circuit using the current control circuit with limiter and a brightness control circuit using the current control circuit with limiter.

2. Description of the Related Art

FIG. 15 shows a conventional example of a current control circuit with limiter. A control input voltage $V_i$ is applied to the non-inverting input terminal of an operational amplifier (hereinafter referred to as "OP-Amp") 1 which operates as a voltage follower. The output of Op-Amp 1 is connected to the non-inverting input of an Op-Amp 6. The output of the Op-Amp 6 is connected to the base input of an NPN transistor 5. The emitter output of the NPN transistor 5 is connected to the inverting input of Op-Amp 6 and is supplied to a load resistance $R_1$.

The entire circuit which is composed of Op-Amp 6, the NPN transistor 5, and the load resistance $R_1$ operates as a voltage follower. The inverting input of Op-Amp 6, that is, the emitter output of the NPN transistor 5 becomes equal to the non-inverting input of Op-Amp 6.

A divided voltage produced by resistor $R_3$ and resistor $R_4$ is applied to the base of a PNP transistor 7. The divided voltage is called a reference voltage (hereinafter referred to as "$V_r$"). The output terminal of the emitter follower composed of the PNP transistor 7 is connected with the inverting input terminal of Op-Amp 1 and the non-inverting input terminal of Op-Amp 6. The inverting input terminal of Op-Amp 1 is connected with the output terminal thereof. A resistor $R_2$ is a bias resistor for the output of Op-Amp 1 and also acts as a load resistor of the emitter follower composed of PNP transistor 7.

In the current control circuit with limiter, when $V_i$ is lower than $V_r + V_{be}$ ($V_{be}$ is the base-emitter voltage of transistor 7, which is the voltage from the emitter to the base), the transistor 7 goes into its Off-state. At this time, Op-Amp 1 operates as a normal voltage follower. Therefore, the emitter voltage of transistor 5 at an output stage follows $V_i$, so an output current $I=V_i/R_1$ proportional to $V_i$ can be produced as the emitter current.

On the other hand, when $V_i$ becomes equal to or higher than $V_r + V_{be}$, transistor 7 goes into its On-state, so that the non-inverting input of Op-Amp 6 is clamped to $V_r + V_{be}$, which is the emitter voltage of transistor 7. At this time, the emitter voltage of transistor 5 at the output stage is also clamped to $V_r + V_{be}$. Therefore, the output current I becomes a constant value $I_{limit}=(V_r+V_{be})/R_1$, so that this circuit operates as a limiter.

FIG. 16 shows another conventional example of a current control circuit with limiter. In FIG. 16, portions identical to those in FIG. 15 are shown with the same reference numbers. In the circuit shown in FIG. 16, a voltage follower circuit composed of an Op-Amp 3 is provided instead of the emitter follower composed of the PNP transistor 7 as shown in FIG. 15. The output terminal of Op-Amp 1 is connected with a diode 2 and the output terminal of the Op-Amp 3 is connected with a diode 4.

When the circuit shown in FIG. 16 is used, the influence of $V_{be}$ of the transistor 7 which is caused in the circuit shown in FIG. 15 can be removed. This is because, the non-inverting input voltage of the Op-Amp 3 becomes $V_r$ and the output of the Op-Amp 3 becomes $V_r-V_f$ ($V_f$ is the forward voltage of the diode 4), so that the voltage follower circuit composed of Op-Amp 3 is stabilized. At this time, the output of the voltage follower is $V_r$, so it is not influenced by diode 4.

A voltage limiter circuit which includes two Zener diodes oppositely connected in series to be able to control a limiter voltage of both polarities with high precision is disclosed in Japanese Utility Model Laid-open No. Hei 5-006929.

The above-mentioned circuit shown in FIG. 15 has a disadvantage that a limiter voltage is varied due to a variation in $V_{be}$ of transistor 7, which is caused by temperature.

In order to overcome this disadvantage, as shown in FIG. 16, Op-Amp 3 is used instead of the transistors, so that the influence of $V_{be}$ of the transistor due to temperature dependence can be removed. However, in the circuit shown in FIG. 16, the number of Op-Amps becomes three, with the result that a circuit scale increases. Therefore, there is a problem with respect to reductions in size and cost.

In the circuit shown in FIG. 16, diode 2 and diode 4 are subjected to wired OR connection. When the circuit serves as a limiter, it is necessary that diode 4 be in an On-state. Therefore, $V_r$ can be set to only a limiter voltage corresponding to the forward voltage $V_f$ of diode 4 as a minimum output voltage. This is because the output of Op-Amp 3 is equal to or higher than 0 V, so it is necessary that the inverting input, that is, $V_r$ be equal to or higher than $V_f$. Thus, when the limiter voltage is lower than $V_f$, the circuit shown in FIG. 16 cannot be used.

Because the Zener diodes are used for the circuit described in Japanese Utility Model Laid-open No. Hei 5-006929, a variation in limiter voltage is directly caused, due to temperature dependence of a Zener voltage, so that the precision of the limiter voltage cannot be ensured.

SUMMARY OF THE INVENTION

The present invention was made to solve the foregoing and other exemplary problems, drawbacks, and disadvantages of the conventional structures.

In view of the problems, drawbacks, and disadvantages, the first exemplary feature of the present invention is to provide a current control circuit with limiter in which a circuit structure is simple and temperature dependence of a limiter voltage is removed, while a linear and high-precision control characteristic is maintained by a voltage follower.

A second exemplary feature of the present invention is to provide a temperature control circuit using the current control circuit with limiter and a brightness control circuit using the current control circuit with limiter.

In an exemplary embodiment of the present invention to attain the above and other exemplary purposes, a current control circuit with limiter includes: a voltage follower which is the output unit of the current control circuit, a transistor being provided in the voltage follower; a first operational amplifier of which the non-inverting input receives an input voltage to the current control circuit, and of which the inverting input receives the output of the voltage follower; a second operational amplifier of which the non-inverting input receives a predetermined voltage, and of which the inverting input receives the output of the voltage follower; a first diode connected between the output of the first operational amplifier and the input of the voltage follower; and a second diode-connected between the output of the second operational amplifier and the input of the voltage follower.

In another exemplary embodiment of the present invention to attain the above and other exemplary purposes, a temperature control circuit includes: a voltage follower which is the output unit of the temperature control circuit, a transistor being provided in the voltage follower; a first operational amplifier of which the non-inverting input receives an input voltage to the temperature control circuit, and of which the inverting input receives the output of the voltage follower; a second operational amplifier of which the non-inverting input receives a predetermined voltage, and of which the inverting input receives the output of the voltage follower; a first diode connected between the output of the first operational amplifier and the input of the voltage follower; a second diode connected between the output of the second operational amplifier and the input of the voltage follower; and a temperature control device which is an output load of the temperature control circuit.

In another exemplary embodiment of the present invention to attain the above and other exemplary purposes, a brightness control circuit includes: a voltage follower which is the output unit of the brightness control circuit, a transistor being provided in the voltage follower; a first operational amplifier of which the non-inverting input receives an input voltage to the brightness control circuit, and of which the inverting input receives an output of the voltage follower; a second operational amplifier of which the non-inverting input receives a predetermined voltage, and of which the inverting input receives the output of the voltage follower; a first diode connected between the output of the first operational amplifier and the input of the voltage follower; a second diode connected between the output of the second operational amplifier and the input of the voltage follower; and a light emitting device which is an output load of the brightness control circuit.

In the present invention, there is an advantage that a current control circuit with limiter can be realized by a simple structure including only two Op-Amps and one transistor. In the present invention, there is also an advantage that it is possible to realize a current control circuit with limiter in which the temperature dependence of the limiter voltage is removed while the linear and high-precision control characteristic of the voltage follower is maintained.

Further, in the present invention, there is the advantage that it is possible to realize the temperature control circuit using the current control circuit with limiter and the brightness control circuit using the current control circuit with limiter.

BRIEF DESCRIPTION OF THE DRAWINGS

The above and other exemplary purposes, features and advantages of the present invention will become more apparent form the following detailed description when taken in conjunction with the accompanying drawings wherein.

DETAILED DESCRIPTION OF THE
EXEMPLARY EMBODIMENTS

1. First Exemplary Embodiment

Embodiments of the present invention will be described with reference to the drawings. In each of the following embodiments, assume that an Op-Amp is an ideal Op-Amp, a voltage gain is sufficiently large, and each of an input offset voltage and an input bias current is sufficiently small and thus can be neglected. Although a power source voltage is set to +5 V, the present invention is not particularly limited to this voltage. Although a reference voltage $V_r$ set as a limiter voltage is 2 V, $V_r$ can be set to an arbitrary voltage within the power source voltage range of the Op-Amp. The same arbitrary setting can similarly be made in each of the following embodiments.

Figure 1:
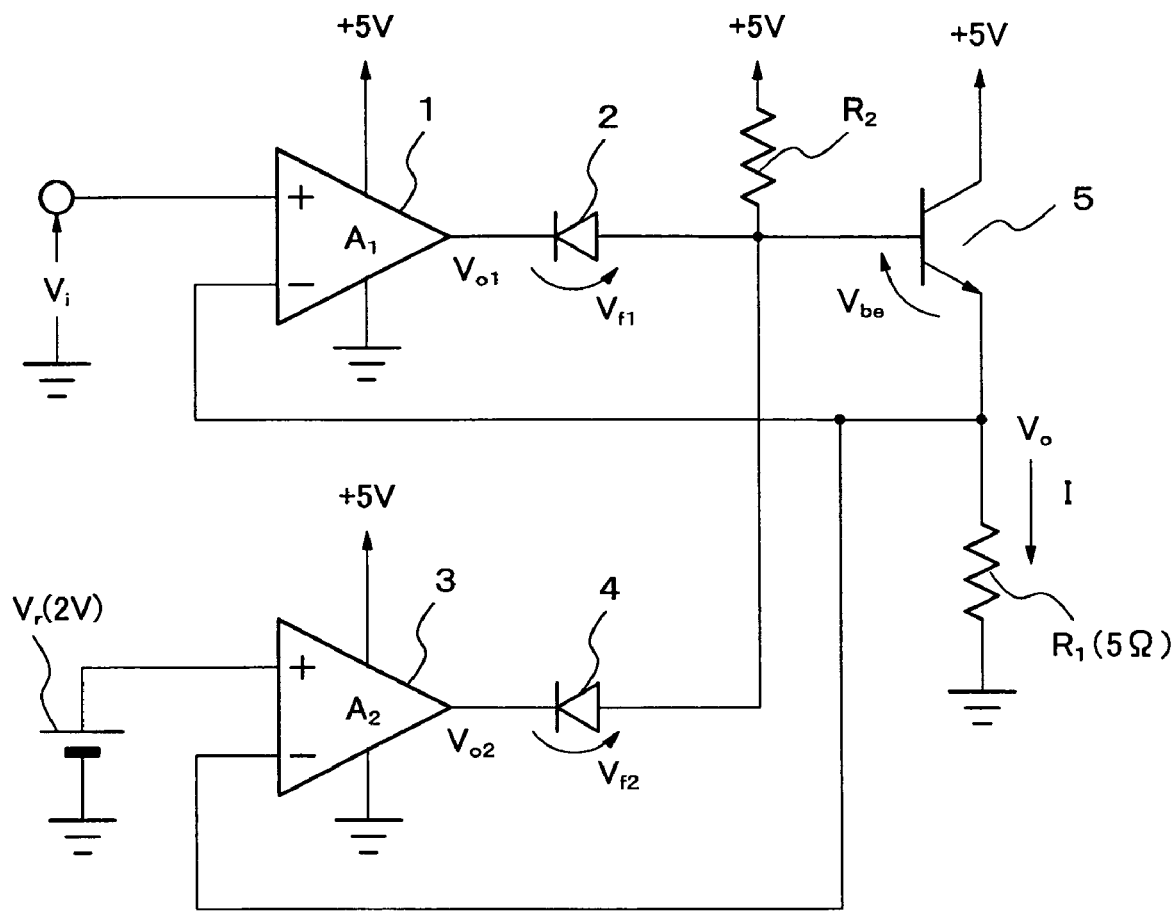
FIG. 1 is a circuit diagram showing a first exemplary embodiment of the present invention.

FIG. 1 is a circuit diagram showing a first embodiment of the present invention. A control input voltage $V_i$ is connected to the non-inverting input of an Op-Amp 1. The output of the Op-Amp 1 is connected through diode 2 to the base input of an NPN transistor 5 composing the emitter follower. The cathode of the diode 2 is connected with the output terminal of the Op-Amp 1 and the anode thereof is connected with the base of the NPN transistor 5.

$V_r$ is connected to the non-inverting input of an Op-Amp 3. The output of Op-Amp 3 is connected through diode 4 to the base input of NPN transistor 5 through a diode 4. The cathode of diode 4 is connected with the output terminal of Op-Amp 3 and the anode thereof is connected with the base of NPN transistor 5.

The emitter output of NPN transistor 5 is connected to each of the inverting inputs of Op-Amp 1 and Op-Amp 3 and is supplied to a load resistor $R_1$. A resistor $R_2$ is a bias resistor for the outputs of Op-Amp 1 and Op-Amp 3.

In the circuit shown in FIG. 1, when $V_i$ is lower than $V_r$, diode 4 subjected to wired OR connection goes into the off-state. Therefore, the feedback circuit of Op-Amp 3 is interrupted and the output thereof is blocked. On the other hand, because diode 2 goes into the On-state, negative feedback is applied to Op-Amp 1, so that the inverting input voltage thereof, that is, the emitter voltage of NPN transistor 5 becomes $V_i$. Therefore, NPN transistor 5 supplies an output current I ($=V_i/R_1$) proportional to $V_i$ to the load resistor $R_1$.

Assume at this time, an input voltage inputted to the inverting input terminal of Op-Amp 3 is $V_i$ and is lower than the non-inverting input $V_r$. Therefore, the output of Op-Amp 3 saturates, so that Op-Amp 3 generates a maximum output voltage. Then, diode 4 is stabilized in the Off-state.

When $V_i$ is equal to or higher than $V_r$, diode 2 goes into the Off-state. Therefore, the feedback circuit of Op-Amp 1 is interrupted and the output thereof is blocked. On the other hand, because diode 4 goes into the On-state, negative feedback is applied to Op-Amp 3, so that the inverting input voltage thereof, that is, the emitter voltage of NPN transistor 5 becomes $V_r$. Therefore, the emitter current of NPN transistor 5, that is, the output current I thereof becomes a constant current of 400 [MA] (=$V_r/R_1$=2 [V]/5 [Ω]). Thus, it is apparent that limiter operation is performed.

Assume at this time, an input voltage inputted to the inverting input terminal of Op-Amp 1 is $V_r$ and is lower than the non-inverting input voltage $V_i$. Therefore, the output of Op-Amp 1 saturates, so that Op-Amp 1 generates a maximum output voltage. Then, diode 2 is stabilized in the Off-state.

The operation of Op-Amp 1 will be described in detail with reference to FIG. 1 and numerical expressions. Assume that diode 2 is in the On-state. When the voltage gain of Op-Amp 1 is expressed by $A_1$ and the output voltage of the emitter follower, that is, the emitter voltage of NPN transistor 5 is expressed by. $V_o$, the output voltage $V_{o1}$ of Op-Amp 1 is obtained by the following equation.

$$V_{o1}=A_1(V_i-V_o)=V_o+V_{be}-V_{f1} \quad (1)$$

Here, $V_{be}$ denotes the base-emitter voltage of NPN transistor 5 and $V_{f1}$ denotes the forward voltage of diode 2.

From the equation (1), $$V_o = \{A_1 V_i - (V_{be} - V_{f1})\}/(1+A_1) \quad (2)$$
$$= A_1 V_i/(1+A_1) - (V_{be} - V_{f1})/(1+A_1)$$

Because $A_1$ is sufficiently larger than 1, $$V_o = A_1 V_i/A_1 - (V_{be} - V_{f1})/A_1 \quad (3)$$
$$\approx V_i$$

Therefore, it is apparent that Op-Amp 1 operates as a voltage follower.

As is apparent from the equation (3), $V_{be}$ and $V_{f1}$ are divided by $A_1$. Therefore, for example, the influence of temperature dependence of each of $V_{be}$ and $V_{f1}$ on $V_o$ can be neglected.

When diode 4 is in the On-state, Op-Amp 3 operates as a voltage follower as in the case of Op-Amp 1. That is, when the voltage gain of Op-Amp 3 is expressed by $A_2$, the output voltage $V_{o2}$ of Op-Amp 3 is obtained by the following equation.

$$V_{o2}=A_2(V_r-V_o)=V_o+V_{be}-V_{f2} \quad (4)$$

Here, $V_{f2}$ denotes the forward voltage of diode 4.

Because $A_2$ is sufficiently larger than 1, from the equation (4), $$V_o = \{A_2 V_r - (V_{be} - V_{f2})\}/(1+A_2) \quad (5)$$
$$= A_2 V_r/(1+A_2) - (V_{be} - V_{f2})/(1+A_2)$$
$$= A_2 V_r/A_2 - (V_{be} - V_{f2})/A_2$$
$$\approx V_r$$

Therefore, it is apparent that Op-Amp 3 operates as the voltage follower.

As is apparent from the equation (5), $V_{be}$ and $V_{f2}$ are divided by $A_2$. Therefore, for example, the influence of temperature dependence of each of $V_{be}$ and $V_{f2}$ on $V_o$ can be neglected.

As described above, when diode 2 is in the On-state, Op-Amp 1 operates as the voltage follower. When diode 4 is in the On-state, Op-Amp 3 operates as the voltage follower.

Therefore, when $V_i$ is lower than $V_r$, the output current I of the circuit according to this embodiment is proportional to $V_i$. When $V_i$ is equal to or higher than $V_r$, the output current I becomes a constant value $I_{limit}=V_r/R_1$. In other words, the circuit according to this embodiment operates as a current control circuit with limiter.

Figure 2:
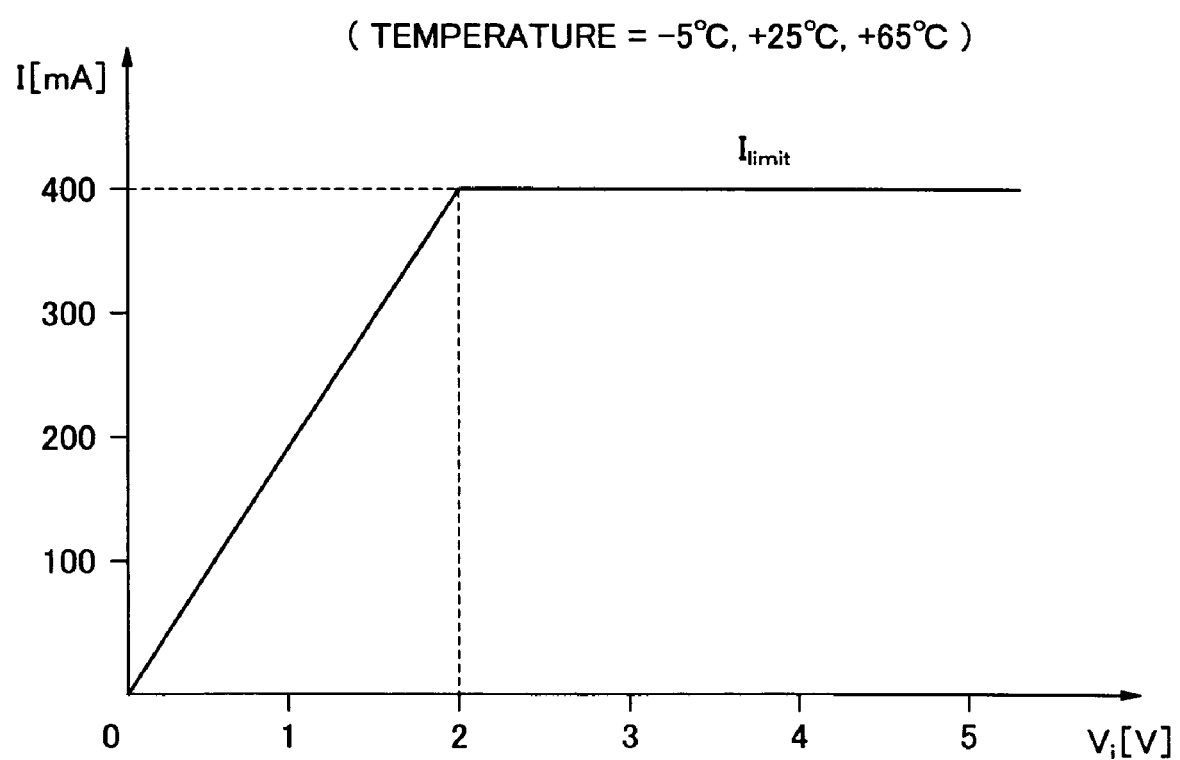
FIG. 2 is a graph showing a result obtained by simulation of the circuit shown in FIG. 1.

FIG. 2 shows a result obtained by simulation of the circuit shown in FIG. 1. In a range in which $V_i$ is smaller than $V_r$ (=2 V), the output current I proportional to $V_i$ flows through $R_1$. In a range in which $V_i$ is equal to or higher than $V_r$, I is limited to a constant current of 400 mA.

This simulation is performed in each of the cases where an ambient temperature of the circuit according to this embodiment is set to −5° C., +25° C., and +65° C. As a result, a characteristic at each temperature is identical to the characteristic shown in FIG. 2, so that a limiter characteristic is not changed by the temperature dependence of each element composing the circuit according to this embodiment. This is because diode 2 and diode 4 subjected to the wired OR connection and NPN transistor 5 are included in the feedback loop of Op-Amp 1 and Op-Amp 3. In the voltage follower having such structure, as is apparent from the equation (3) and the equation (5), $V_{be}$, $V_{f1}$, and $V_{f2}$ are divided by $A_1$. Therefore, for example, the influence of temperature dependence of each of $V_{be}$, $V_{f1}$, and $V_{f2}$ on $V_o$ can be neglected.

When $V_r > V_{be}$ is held in the circuit shown in FIG. 1, a minimum value of the limiter voltage can be freely set. Therefore, the minimum value of the limiter voltage is not limited. This will be described in detail with reference to FIG. 1 and numerical expressions.

The output voltage $V_{o2}$ of Op-Amp 3 is obtained by the following equation.

$$V_{o2}=V_r+V_{be}-V_{f2} \quad (6)$$

Here, $V_{f2}$ denotes the forward voltage of diode 4.

Because $V_{o2}$ is continuously equal to or higher than 0 V in the equation (4), $$V_{o2}=V_r+(V_{be}-V_{f2}) \geq 0 \quad (7)$$

If $V_{be}-V_{f2}>0$, the equation (7) is constantly satisfied in the case where $V_r$ is equal to or larger than 0. In other words, when $V_{be}>V_{f2}$, a minimum value of $V_r$ can be set to 0.

As is also apparent from the result obtained by simulation as shown in FIG. 2, the circuit according to this embodiment operates without any difficulties in $V_i$ range of 0 V to 5 V.

Thus, it is found from the simulation that the circuit can operate even when the limiter voltage is a low voltage.

As described above, according to this embodiment, the current control circuit with limiter can be realized by the simple structure including only two Op-Amps and one NPN transistor. The circuit according to this embodiment has the advantages that there is no temperature dependence and a low limiter voltage can be set.

The current control circuit with limiter according to the first embodiment is a current control circuit with limiter, of a type for supplying a current to a load.

2. Second Exemplary Embodiment

In the first embodiment, the emitter follower is composed of the NPN transistor 5. The emitter follower can be composed of a PNP transistor. The transistor to be used is not limited to a bipolar transistor. It is apparent that a source follower composed of a field effect transistor including a MOS transistor may be used. At this time, the channel type of the field effect transistor may be an N-channel type or a P-channel type.

Next, an exemplary embodiment of the present invention in a case where the NPN transistor 5 is replaced by another type of transistor will be described.

Figure 3:
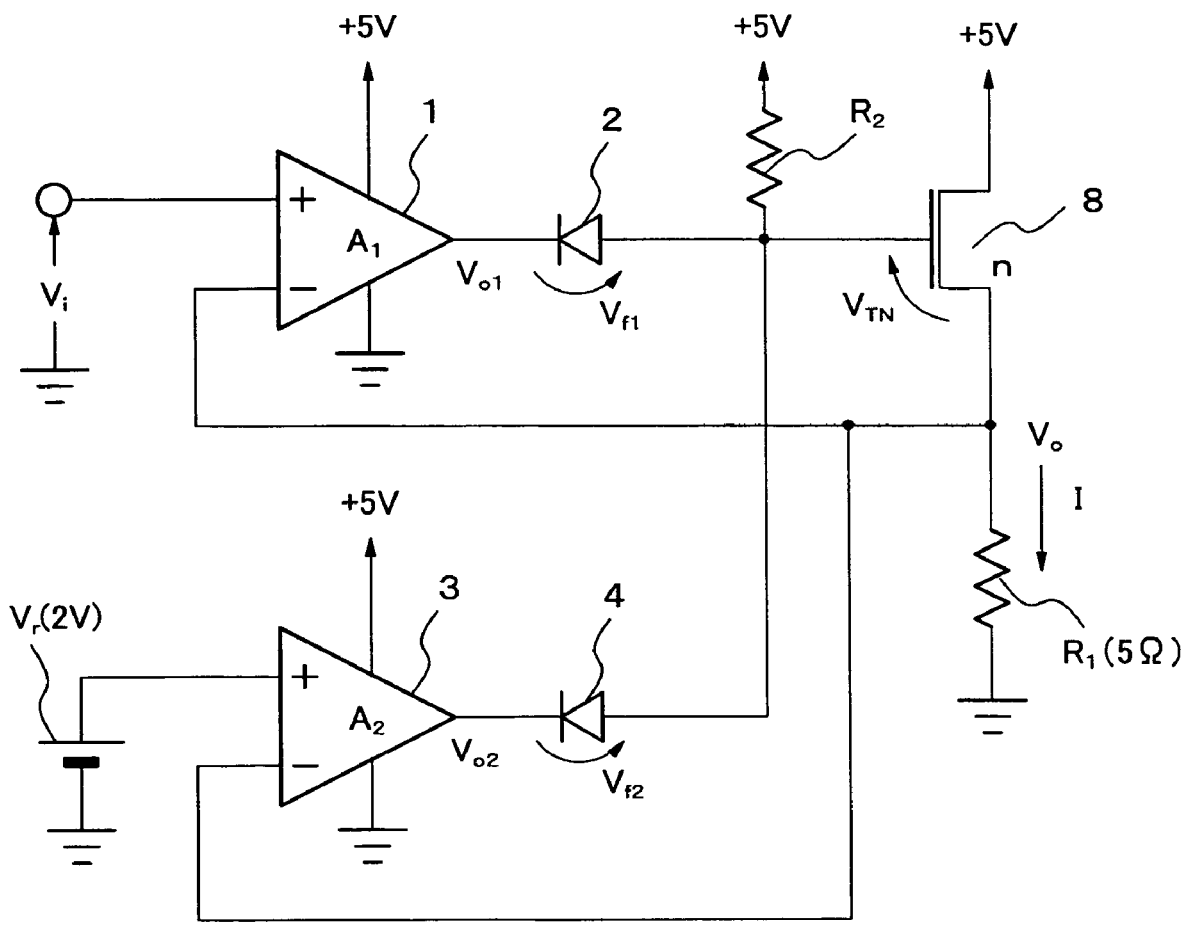
FIG. 3 is a circuit diagram showing a second exemplary embodiment of the present invention.

FIG. 3 is a circuit diagram showing a second exemplary embodiment of the present invention. The NPN transistor 5 shown in FIG. 1 is replaced by an n-channel field effect transistor 8. The operation of a circuit according to the second embodiment will be described with reference to FIG. 3 and numerical expressions.

First, the operation of Op-Amp 1 will be described. Assume that diode 2 is in the On-state. In the second exemplary embodiment, $V_{be}$ in the equation (1) is replaced by the threshold voltage $V_{TN}$ of the n-channel field effect transistor 8, so the following equation is obtained.

$$V_{o1} = A_1(V_i - V_o) = V_o + V_{TN} - V_{f1} \tag{8}$$

Therefore, $$V_o = \{A_1 V_i - (V_{TN} - V_{f1})\}/(1 + A_1) \tag{9}$$

$$\approx V_i$$

Thus, it is apparent that Op-Amp 1 operates as a voltage follower.

Similarly, Op-Amp 3 operates as a voltage follower, so the description thereof is omitted here.

As described above, when diode 2 is in the On-state, Op-Amp 1 operates as the voltage follower. When diode 4 is in the On-state, Op-Amp 3 operates as the voltage follower.

Therefore, as in the first exemplary embodiment, when $V_i$ is lower than $V_r$, the output current I of the circuit according to the second embodiment is proportional to $V_i$. When $V_i$ is equal to or higher than $V_r$, the output current I becomes the constant value $I_{limit} = V_r/R_1$. In other words, the circuit according to the second embodiment operates as a current control circuit with limiter.

As is apparent from the equation (9), $V_{TN}$ and $V_{f1}$ are divided by $A_1$, so that, for example, the influence of temperature dependence of each of $V_{TN}$ and $V_{f1}$ on $V_o$ can be neglected. In addition, $V_{f2}$ are divided by $A_1$, so that, for example, the influence of temperature dependence of $V_{f2}$ on $V_o$ can be neglected.

When $V_i > V_{TN}$ is held, the minimum value of the limiter voltage can be freely set, so that the minimum value of the limiter voltage is not limited as in the first embodiment. The description is omitted here.

A characteristic of the current control circuit with limiter according to the second embodiment is identical to that in the first embodiment. A relationship between $V_i$ and the output current I as shown in FIG. 2 is obtained.

As described above, according to this exemplary embodiment, the current control circuit with limiter can be realized by the simple structure including only two Op-Amps and one n-channel field effect transistor. The circuit according to this exemplary embodiment has the advantages that there is no temperature dependence and a low limiter voltage can be set.

The current control circuit with limiter according to the second exemplary embodiment is a current control circuit with limiter, of a type for supplying a current to a load.

3. Third Exemplary Embodiment

Figure 4:
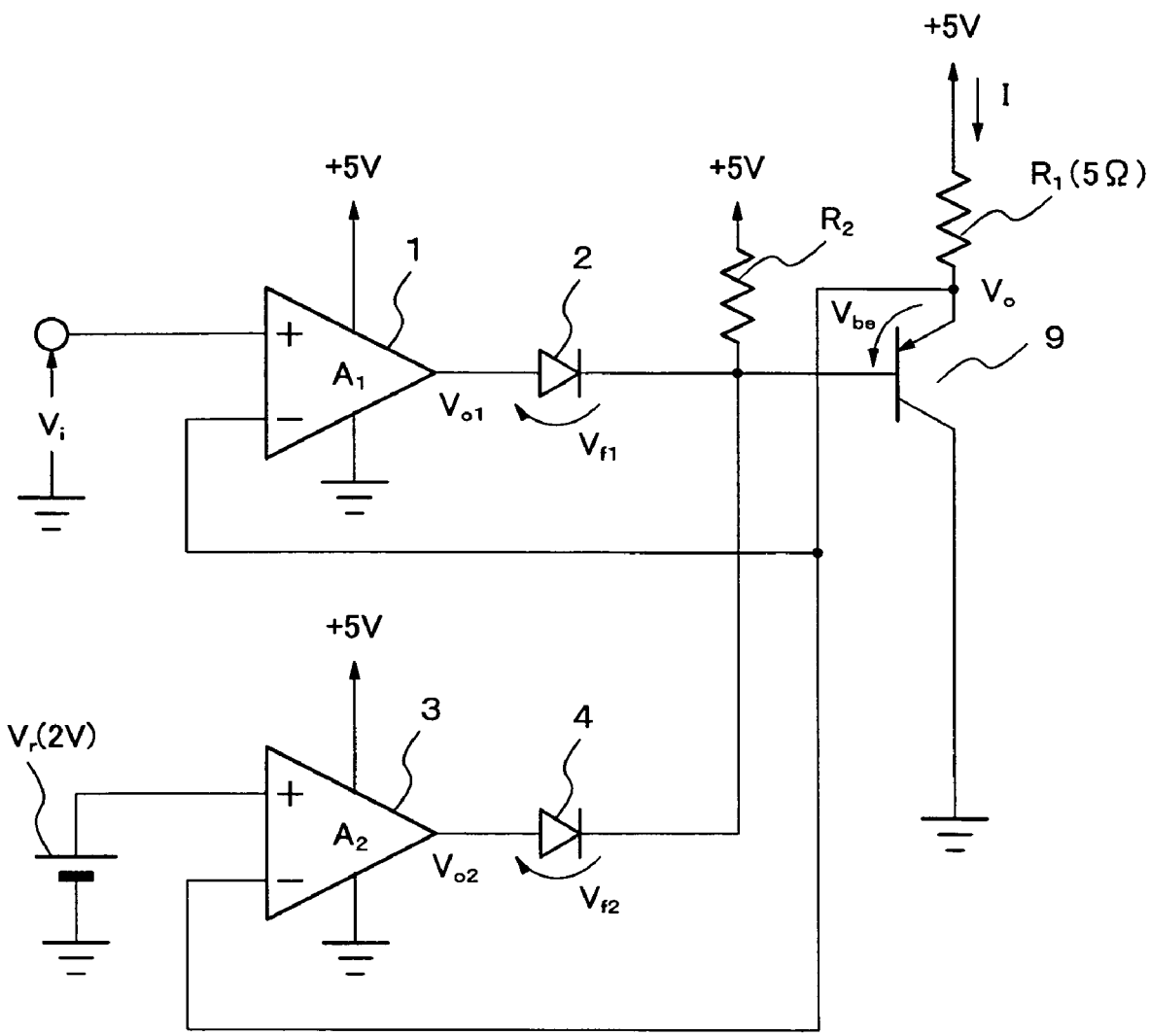
FIG. 4 is a circuit diagram showing a third exemplary embodiment of the present invention.

FIG. 4 is a circuit diagram showing a third exemplary embodiment of the present invention. The NPN transistor 5 shown in FIG. 1 is replaced by a PNP transistor 9. In the third exemplary embodiment, the connection direction of each of diode 2 and diode 4 is reversed to that in each of the first exemplary embodiment and the second exemplary embodiment. That is, the anode of diode 2 is connected with the output terminal of Op-Amp 1 and the cathode thereof is connected with the base of the PNP transistor 9. The anode of diode 4 is connected with the output terminal of the Op-Amp 3 and the cathode thereof is connected with the base of PNP transistor 9.

In the circuit shown in FIG. 4, when $V_i$ is higher than $V_r$, diode 4 subjected to wired OR connection goes into the Off-state. Therefore, the feedback circuit of Op-Amp 3 is interrupted and the output thereof is blocked. On the other hand, because diode 2 goes into the On-state, negative feedback is applied to Op-Amp 1, so that the inverting input voltage thereof, that is, the emitter voltage of PNP transistor 9 becomes $V_i$. Therefore, the PNP transistor 9 supplies an output current I ($=(5-V_i)/R_1$) proportional to a difference between the power source voltage and $V_i$ to the load resistor $R_1$.

Assume, at this time, an input voltage inputted to the inverting input terminal of Op-Amp 3 is $V_i$ and is higher than the non-inverting input $V_r$. Therefore, the output of Op-Amp 3 saturates, so that Op-Amp 3 generates a minimum output voltage. Then, diode 4 is stabilized in the Off-state.

When $V_i$ is equal to or lower than $V_r$, diode 2 goes into the Off-state. Therefore, the feedback circuit of the Op-Amp 1 is interrupted and the output thereof is blocked. On the other hand, because diode 4 goes into the On-state, negative feedback is applied to Op-Amp 3, so that the inverting input voltage thereof, that is, the emitter voltage of PNP transistor 9 becomes $V_r$. Therefore, the emitter current of PNP transistor 9, that is, the output current I thereof becomes a constant current of 600 [mA] ($=V_r(5-V_r)/R_1=3[V]/5[\Omega]$). Thus, it is apparent that limiter operation is performed.

Assume at this time, an input voltage inputted to the inverting input terminal of Op-Amp 1 is $V_r$ and is higher than the non-inverting input voltage $V_i$. Therefore, the output of Op-Amp 1 saturates, so that Op-Amp 1 generates a minimum output voltage. Then, diode 2 is stabilized in the Off-state.

The operation of a circuit according to the third exemplary embodiment will be described with reference to FIG. 4 and numerical expressions. First, the operation of Op-Amp 1 will be described. Assume that diode 2 is in the On-state. In the third exemplary embodiment, the direction of $V_{f1}$ is reverse to that in the equation (1), so the following equation is obtained.

$$V_{o1} = A_1(V_i - V_o) \qquad (10)$$
$$= V_o + V_{be} + V_{f1}$$
$$= V_o + (V_{be} + V_{f1})$$

Therefore, $$V_o = \{A_1 V_i - (V_{be} + V_{f1})\}/(1 + A_1) \qquad (11)$$
$$\approx V_i$$

Thus, it is apparent that Op-Amp 1 operates as a voltage follower.

Similarly, Op-Amp 3 operates as a voltage follower, so the description thereof is omitted here.

As described above, when diode 2 is in the On-state, Op-Amp 1 operates as the voltage follower. When diode 4 is in the On-state, Op-Amp 3 operates as the voltage follower.

Therefore, when $V_i$ is higher than $V_r$, the output current I of the circuit according to the third exemplary embodiment is proportional to $(5-V_i)$. When $V_i$ is equal to or lower than $V_r$, the output current I becomes the constant value $I_{limit}=(5-V_r)/R_1$. In other words, the circuit according to the third exemplary embodiment operates as a current control circuit with limiter.

As is apparent from the equation (11), $V_{be}$ and $V_{f1}$ are divided by $A_1$, so that, for example, the influence of temperature dependence of each of $V_{be}$ and $V_{f1}$ on $V_o$ can be neglected. In addition, $V_{f2}$ is divided by $A_1$, so that, for example, the influence of temperature dependence of $V_{f2}$ on $V_o$ can be neglected.

In the circuit shown in FIG. 4, a voltage applied to each of diode 2 and diode 4 becomes the base voltage of PNP transistor 9 forming a voltage follower. Therefore, $V_{be}$ of PNP transistor 9 is continuously added to each of the voltages $V_{f1}$ and $V_{f2}$ of diode 2 and diode 4. Thus, when $V_{f2} > V_{be}$ is held, a minimum value of the limiter voltage can be freely set, so that the minimum value of the limiter voltage is not limited.

This will be described in more detail with reference to FIG. 4 and numerical expressions. The output voltage $V_{o2}$ of Op-Amp 3 is obtained by the following equation.

$$V_{o2}=V_r+V_{be}+V_{f2}=V_r+(V_{be}+V_{f2}) \qquad (12)$$

Here, $V_{f2}$ denotes the forward voltage of diode 4.

Because $V_{o2}$ is continuously equal to or lower than 5 V which is the power source voltage in the equation (12), $$V_{o2}=V_r+(V_{be}+V_{f2}) \leq 5 \qquad (13)$$

If $V_{be}+V_{f2}<0$, the equation (13) is constantly satisfied in the case where $V_r$ is equal to or lower than 5 V. In other words, as $V_{be}$ of PNP transistor 9 is a negative number, when $|V_{be}|>V_{f2}$, a maximum value of $V_r$ can be set to 5 V. This means that a difference between the power source voltage and $V_r$ may be 0, that is, a minimum value of a voltage applied across $R_1$ may be 0.

Figure 5:
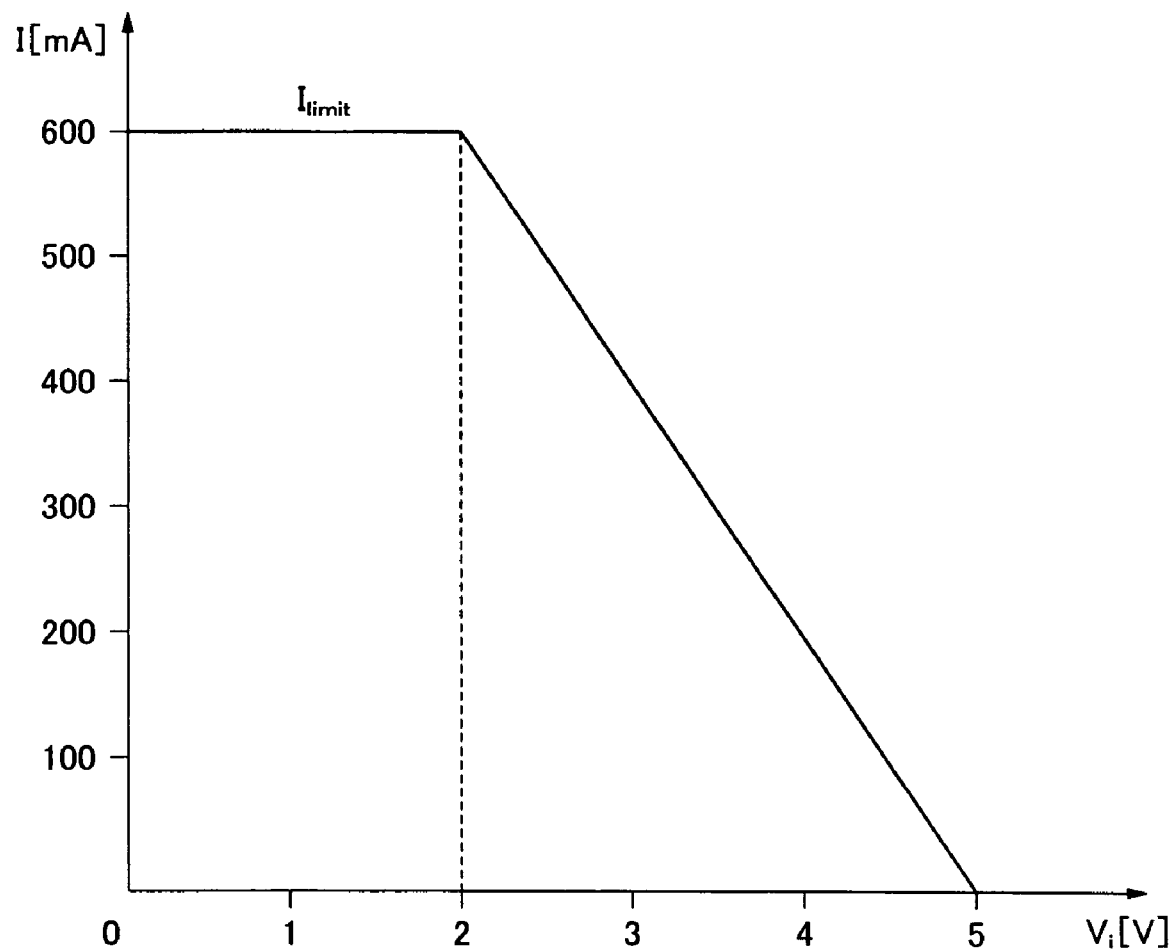
FIG. 5 is a graph showing a characteristic of a circuit shown in FIG. 4.

In the third exemplary embodiment, when $V_i$ is equal to or lower than 2 V, the voltage applied across $R_1$ is limited to 3 V (=5 V−2 V) and I becomes constant 0.6 [A] (=3[V]/5[V]A). When $V_i$ is higher than 2 V, I becomes $(5-V_i)/R_1$. Therefore, a relationship between $V_i$ and the output current I as shown in FIG. 5 is obtained.

As described above, according to this exemplary embodiment, the current control circuit with limiter can be realized by the simple structure including only two Op-Amps and one PNP transistor. The circuit according to this exemplary embodiment has the advantages that there is no temperature dependence and a low limiter voltage can be set.

Unlike the first exemplary embodiment, the current control circuit with limiter according to the third exemplary embodiment is a current control circuit with limiter, of a type for drawing out a current from a load.

4. Fourth Exemplary Embodiment

Figure 6:
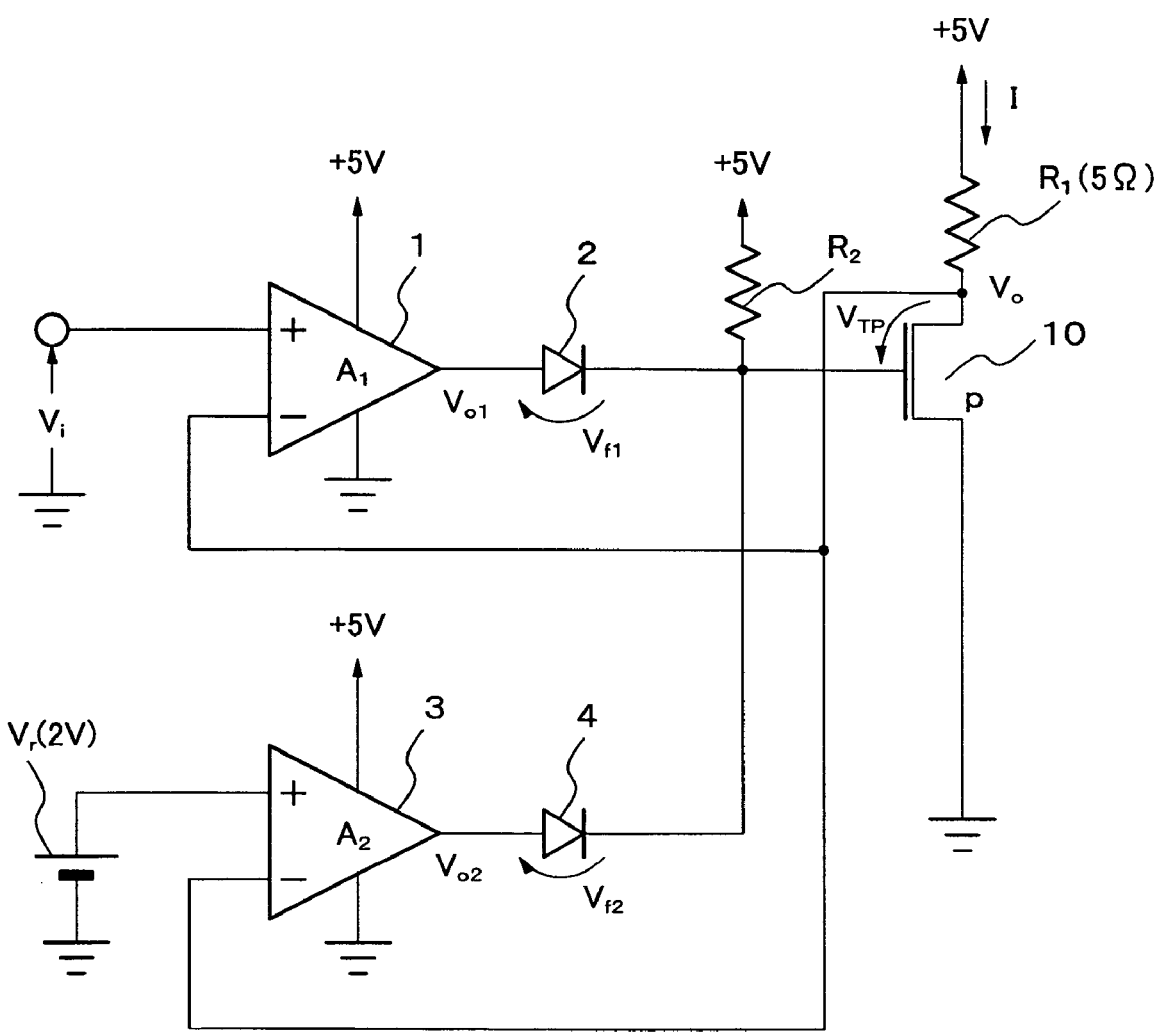
FIG. 6 is a circuit diagram showing a fourth exemplary embodiment of the present invention.

FIG. 6 is a circuit diagram showing a fourth exemplary embodiment of the present invention. The PNP transistor 9 shown in FIG. 4 is replaced by a p-channel field effect transistor 10. The operation of a circuit according to the fourth exemplary embodiment will be described with reference to FIG. 6 and numerical expressions.

First, the operation of Op-Amp 1 will be described. Assume that diode 2 is in the On-state. In the fourth exemplary embodiment, $V_{be}$ in the equation (10) is only replaced by a threshold voltage $V_{TP}$ of the p-channel field effect transistor 10, so the following equation is obtained.

$$V_{o1} = A_1(V_i - V_o) \qquad (14)$$
$$= V_o + V_{TP} + V_{f1}$$
$$= V_o + (V_{TP} + V_{f1})$$

Therefore, $$V_o = \{A_1 V_i - (V_{TP} + V_{f1})\}/(1 + A_1) \qquad (15)$$
$$\approx V_i$$

Thus, it is apparent that Op-Amp 1 operates as a voltage follower.

Similarly, Op-Amp 3 operates as a voltage follower, so the description thereof is omitted here.

As described above, when diode 2 is in the On-state, Op-Amp 1 operates as the voltage follower. When diode 4 is in the On-state, Op-Amp 3 operates as the voltage follower.

Therefore, as in the third exemplary embodiment, when $V_i$ is higher than $V_r$, the output current I of the circuit according to the fourth embodiment is proportional to $(5-V_i)$. When $V_i$ is equal to or lower than $V_r$, the output current I becomes the constant value $I_{limit}=(5-V_r)/R_1$. In other words, the circuit according to the fourth exemplary embodiment operates as a current control circuit with limiter.

As is apparent from the equation (15), $V_{TP}$ and $V_{f1}$ are divided by $A_1$, so that, for example, the influence of temperature dependence of each of $V_{TP}$ and $V_{f1}$ on $V_o$ can be neglected. In addition, $V_{f2}$ is divided by $A_1$, so that, for example, the influence of temperature dependence of $V_{f2}$ on $V_o$ can be neglected.

When $V_{f2} > V_{TP}$ is held, the minimum value of the limiter voltage, which is a voltage applied on a load, can be freely set, so that the minimum value of the limiter voltage is not limited as in the third embodiment. The description is omitted here.

A characteristic of the current control circuit with limiter according to the fourth exemplary embodiment is identical to that in the third embodiment. A relationship between $V_i$ and the output current I as shown in FIG. 5 is obtained.

As described above, according to this exemplary embodiment, the current control circuit with limiter can be realized by the simple structure including only two Op-Amps and one p-channel field effect transistor. The circuit according to this exemplary embodiment has the advantages that there is no temperature dependence and a low limiter voltage can be set.

The current control circuit with limiter according to the fourth exemplary embodiment is also a current control circuit with limiter, of a type for drawing out a current from a load.

5. Fifth Exemplary Embodiment

In each of the first to fourth exemplary embodiments, the maximum value of the output current is limited. The current control circuit with limiter according to the present invention can also limit a minimum value of the output current. That is, this circuit can operate to ensure an output current equal to or larger than a predetermined value without depending on the input voltage. In order to realize this, the orientation of each of the two diodes is reversed in each of the first to fourth exemplary embodiments.

Figure 7:
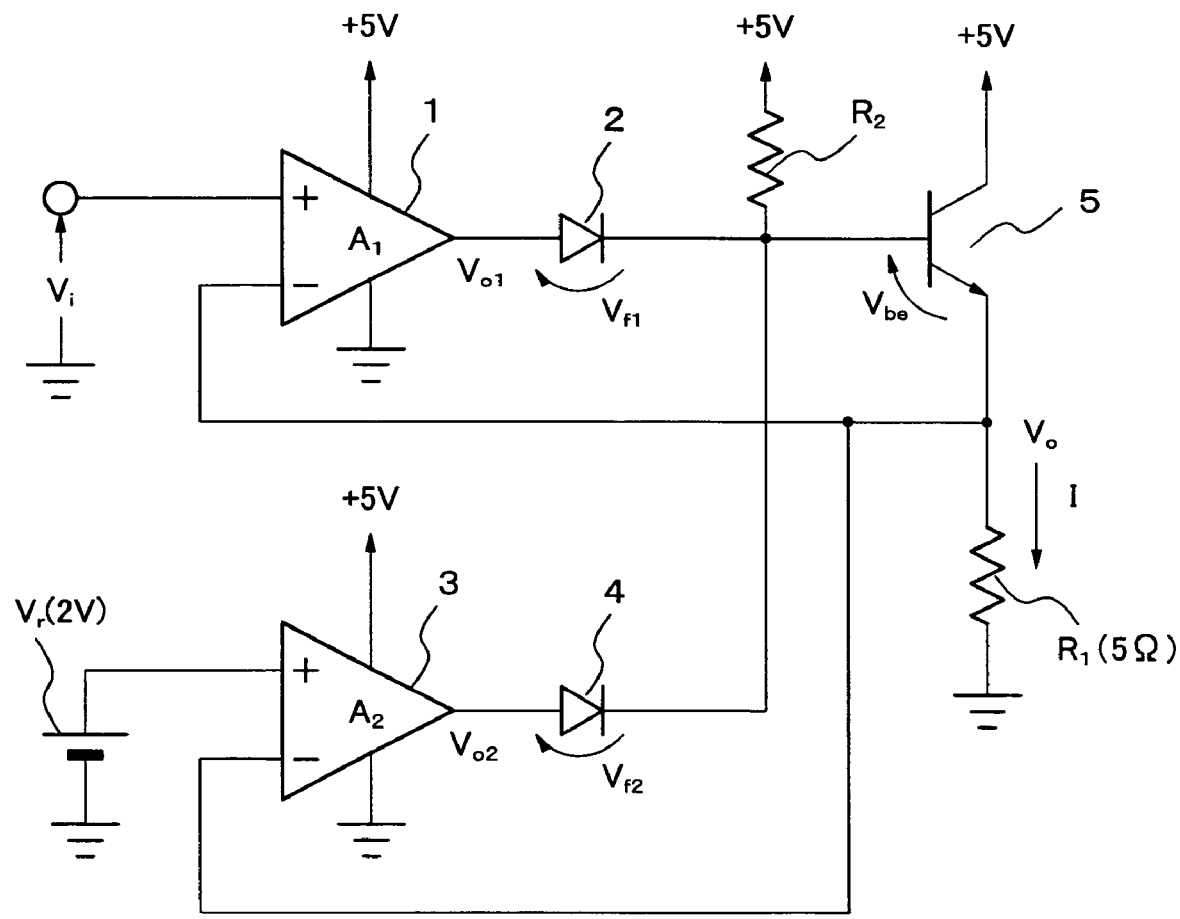
FIG. 7 is a circuit diagram showing a fifth exemplary embodiment of the present invention.

FIG. 7 is a circuit diagram showing a fifth exemplary embodiment of the present invention, in which the orientations of diodes 2 and 4 are reversed in the current control circuit with limiter (FIG. 1) according to the first exemplary embodiment.

In the circuit shown in FIG. 7, when $V_i$ is higher than $V_r$, diode 4 subjected to wired OR connection goes into the Off-state. Therefore, the feedback circuit of Op-Amp 3 is interrupted and the output thereof is blocked. On the other hand, because diode 2 goes into the On-state, negative feedback is applied to Op-Amp 1, so that the inverting input voltage thereof, that is, the emitter voltage of the NPN transistor 5 becomes $V_i$. Therefore, the NPN transistor 5 supplies an output current $I (=V_i/R_1)$ proportional to $V_i$ to the load resistor $R_1$.

Assume at this time, an input voltage inputted to the inverting input terminal of Op-Amp 3 is $V_i$ and is higher than the non-inverting input $V_r$. Therefore, the output of Op-Amp 3 saturates, so that Op-Amp 3 generates a minimum output voltage. Then, diode 4 is stabilized in the Off-state.

When $V_i$ is equal to or lower than $V_r$, diode 2 goes into the Off-state. Therefore, the feedback circuit of Op-Amp 1 is interrupted and the output thereof is blocked. On the other hand, because diode 4 goes into the On-state, negative feedback is applied to Op-Amp 3, so that the inverting input voltage thereof, that is, the emitter voltage of NPN transistor 5 becomes $V_r$. Therefore, the emitter current of NPN transistor 5, that is, the output current I thereof becomes a constant current of 400 [mA] $(=V_r/R_1=2 [V]/5 [\Omega])$. Thus, it is apparent that limiter operation is performed.

Assume at this time, an input voltage inputted to the inverting input terminal of Op-Amp 1 is $V_r$ and is higher than the non-inverting input $V_i$. Therefore, the output of Op-Amp 1 saturates, so that Op-Amp 1 generates a minimum output voltage. Then, diode 2 is stabilized in the Off-state.

The operation of a circuit according to the fifth exemplary embodiment will be described with reference to FIG. 7 and numerical expressions.

First, the operation of Op-Amp 1 will be described. Assume that diode 2 is in the On-state. In the fifth exemplary embodiment, $V_{f1}$ in the equation (1) of the first embodiment only changes in sign, so the following equation is obtained.

$$V_{o1} = A_1(V_i - V_o) = V_o + V_{be} + V_{f1} \quad (16)$$

Therefore, $$V_o = \{A_1 V_i - (V_{be} + V_{f1})\}/(1 + A_1) \quad (17)$$
$$\approx V_i$$

Thus, it is apparent that Op-Amp 1 operates as a voltage follower.

Similarly, Op-Amp 3 operates as a voltage follower, so the description thereof is omitted here.

As described above, when diode 2 is in the On-state, Op-Amp 1 operates as the voltage follower. When diode 4 is in the On-state, Op-Amp 3 operates as the voltage follower.

Therefore, when $V_i$ is higher than $V_r$, the output current I of the circuit according to the fifth exemplary embodiment is proportional to $V_i$. When $V_i$ is equal to or lower than $V_r$, the output current I becomes the constant value $I_{limit}=V_r/R_1$. In other words, the circuit according to the fifth exemplary embodiment operates as a current control circuit with limiter, which limits the minimum value of I.

As is apparent from the equation (17), $V_{be}$ and $V_{f1}$ are divided by $A_1$, so that, for example, the influence of temperature dependence of each of $V_{be}$ and $V_{f1}$ on $V_o$ can be neglected. In addition, $V_{f2}$ is divided by $A_1$, so that, as in the first embodiment, the influence of temperature dependence of $V_{f2}$ on $V_o$ can be neglected.

Note that the output voltage $V_{o2}$ of Op-Amp 3 is obtained by the following equation.

$$V_{o2}=V_r+V_{be}+V_{f2} \quad (18)$$

Because $V_{o2}$ is equal to or lower than 5 V, $$V_r=V_{o2}-(V_{be}+V_{f2}) \leq 5-(V_{be}+V_{f2}) \quad (19)$$

It is necessary to set $V_r$ which is the limiter voltage in a range satisfying the equation (19).

Figure 8:
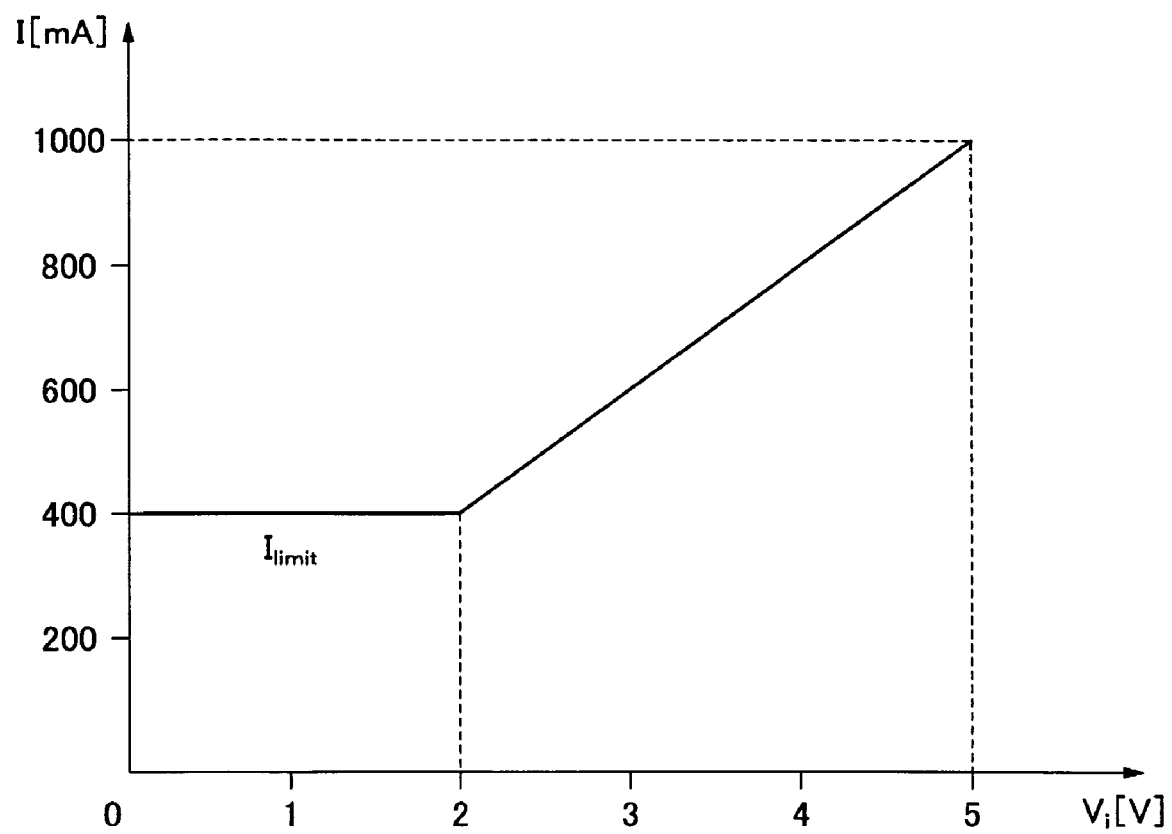
FIG. 8 is a graph showing a characteristic of a circuit shown in FIG. 7.

A relationship between $V_i$ and the output current I of the current control circuit with limiter according to the fifth exemplary embodiment is obtained as shown in FIG. 8.

As described above, according to this exemplary embodiment, the current control circuit with limiter can be realized by the simple structure including only two Op-Amps and one NPN transistor. The circuit according to this embodiment can limit the minimum value of the output current. That is, the circuit can ensure the output current equal to or larger than the predetermined value without depending on the input voltage. The circuit has an advantage that there is no temperature dependence.

The current control circuit with limiter according to the fifth exemplary embodiment is a current control circuit with limiter, of a type for supplying a current to a load.

6. Sixth Exemplary Embodiment

The NPN transistor in the fifth exemplary embodiment may be an n-channel field effect transistor.

Figure 9:
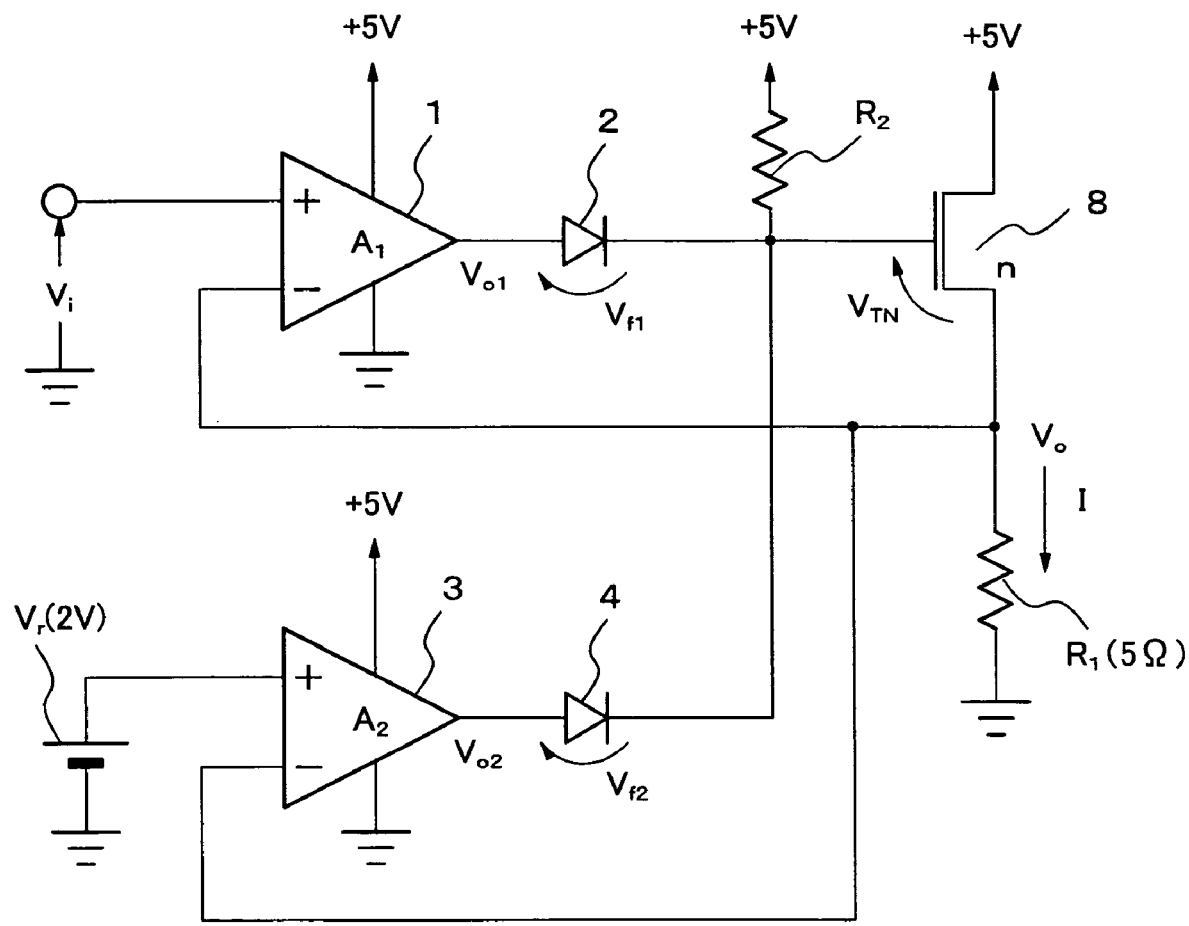
FIG. 9 is a circuit diagram showing a sixth exemplary embodiment of the present invention.

FIG. 9 is a circuit diagram showing a sixth exemplary embodiment of the present invention. The NPN transistor 5 is replaced by the n-channel field effect transistor 8.

Other circuit structures and circuit operations are identical to those in the fifth exemplary embodiment and thus the descriptions thereof are omitted here.

A relationship between $V_i$ and the output current I of the current control circuit with limiter according to the sixth exemplary embodiment is also obtained as shown in FIG. 8.

As described above, according to this exemplary embodiment, the current control circuit with limiter can be realized by the simple structure including only two Op-Amps and one n-channel field effect transistor. The circuit according to this exemplary embodiment can limit the minimum value of the output current. That is, the circuit can ensure the output current equal to or larger than the predetermined value without depending on the input voltage. The circuit also has an effect in which there is no temperature dependence.

The current control circuit with limiter according to the sixth exemplary embodiment is also a current control circuit with limiter, of a type for supplying a current to a load.

7. Seventh Exemplary Embodiment

In the third exemplary embodiment, even when the orientation of each of the two diodes is reversed, the minimum value of the output, current can be limited.

Figure 10:
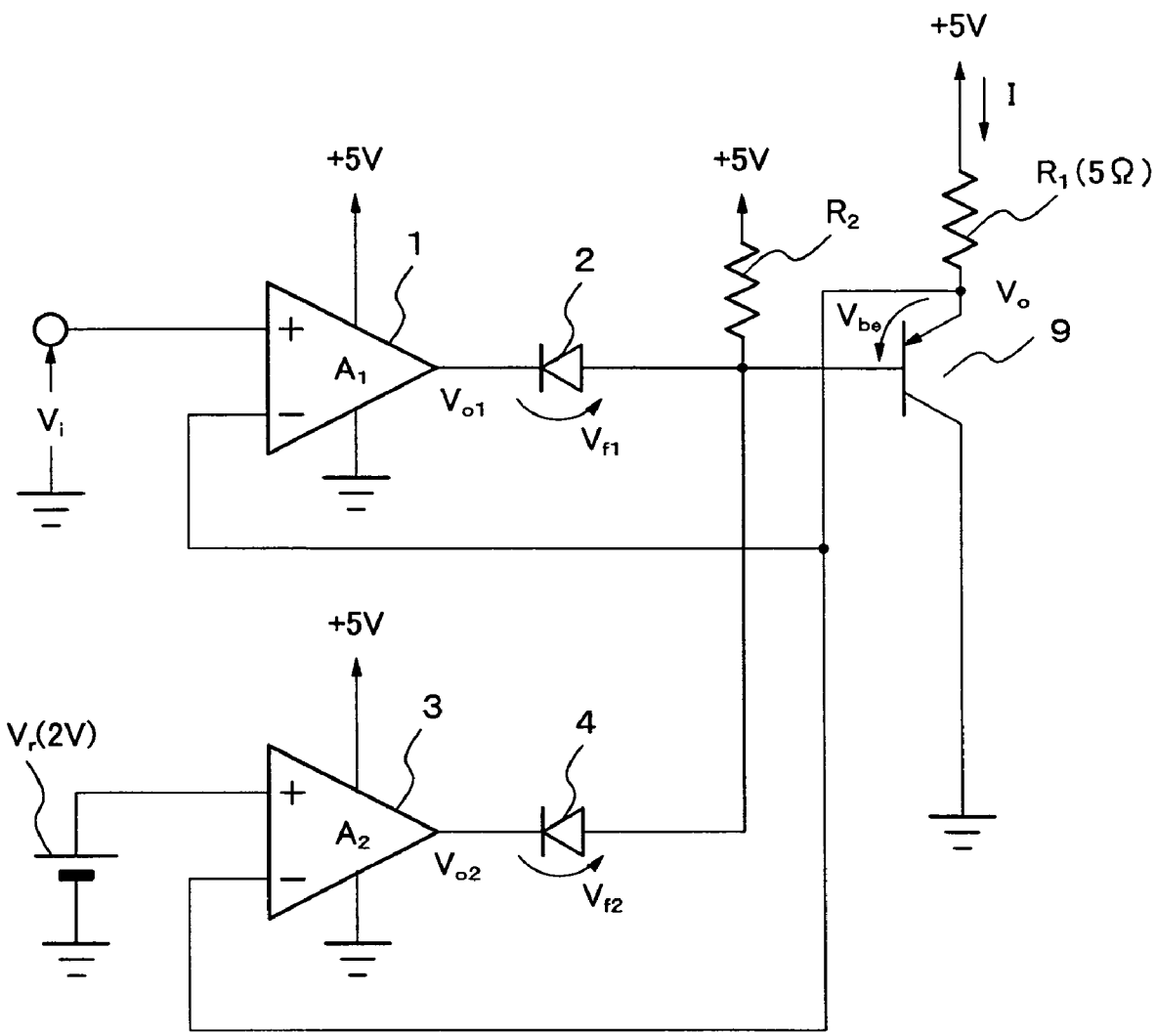
FIG. 10 is a circuit diagram showing a seventh exemplary embodiment of the present invention.

FIG. 10 is a circuit diagram showing a seventh exemplary embodiment of the present invention in which the orientation of each of diode 2 and diode 4 of the current control circuit with limiter according to the third embodiment (FIG. 4) is reversed.

In the circuit shown in FIG. 10, when $V_i$ is lower than $V_r$, diode 4 subjected to wired OR connection goes into the Off-state. Therefore, the feedback circuit of Op-Amp 3 is interrupted and the output thereof is blocked. On the other hand, because diode 2 goes into the On-state, negative feedback is applied to Op-Amp 1, so that the inverting input voltage thereof, that is, the emitter voltage of PNP transistor 9 becomes $V_i$. Therefore, PNP transistor 9 supplies an output current I (=$(5-V_i)/R_1$) proportional to the difference between the power source voltage and $V_i$ to the load resistor $R_1$.

Assume at this time, an input voltage inputted to the inverting input terminal of Op-Amp 3 is $V_i$ and is lower than the non-inverting input $V_r$. Therefore, the output of Op-Amp 3 saturates, so that Op-Amp 3 generates a maximum output voltage. Then, diode 4 is stabilized in the Off-state.

When $V_i$ is equal to or higher than $V_r$, diode 2 goes into the Off-state. Therefore, the feedback circuit of Op-Amp 1 is interrupted and the output thereof is blocked. On the other hand, because diode 4 goes into the On-state, negative feedback is applied to Op-Amp 3, so that the inverting input voltage thereof, that is, the emitter voltage of PNP transistor 9 becomes $V_r$. Therefore, the emitter current of PNP transistor 9, that is, the output current I thereof becomes a constant current of 400 [mA] (=$(5-V_r)/R_1$=3[V]/5[Ω]). Thus, it is apparent that limiter operation is performed.

At this time, an input voltage inputted to the inverting input terminal of Op-Amp 1 is $V_r$ and is lower than the non-inverting input $V_i$. Therefore, the output of Op-Amp 1 saturates, so that Op-Amp 1 generates a maximum output voltage. Then, diode 2 is stabilized in the Off-state.

The operation of a circuit according to the seventh exemplary embodiment will be described with reference to FIG. 10 and numerical expressions.

First, the operation of Op-Amp 1 will be described. Assume that diode 2 is in the On-state. In the seventh embodiment, $V_{f1}$ in the equation (10) only changes in sign, so the following equation is obtained.

$$V_{o1} = A_1(V_i - V_o) = V_o + V_{be} + V_{f1} \tag{20}$$

Therefore, $$V_o = \{A_1 V_i - (V_{be} + V_{f1})\}/(1 + A_1) \tag{21}$$
$$\approx V_i$$

Thus, it is apparent that Op-Amp 1 operates as a voltage follower.

Similarly, Op-Amp 3 operates as a voltage follower, so the description thereof is omitted here.

As described above, when diode 2 is in the On-state, Op-Amp 1 operates as the voltage follower. When diode 4 is in the On-state, Op-Amp 3 operates as the voltage follower.

Therefore, when $V_i$ is lower than $V_r$, the output current I of the circuit according to the seventh embodiment is proportional to ($5-V_i$). When $V_i$ is equal to or higher than $V_r$, the output current I becomes the constant value $I_{limit}$=$(5-V_r)/R_1$. In other words, the circuit according to the seventh embodiment operates as a current control circuit with limiter, which limits the minimum value of I.

As is apparent from the equation (21), $V_{TN}$ and $V_{f1}$ are divided by $A_1$, so that the influence of temperature dependence of each of $V_{TN}$ and $V_{f1}$ on $V_o$ can be neglected. In addition, $V_{f2}$ are divided by $A_1$, so that, as in the third embodiment, the influence of temperature dependence of $V_{f2}$ on $V_o$ can be neglected.

Note that the output voltage $V_{o2}$ of Op-Amp 3 is obtained by the following equation.

$$V_{o2} = V_r + V_{be} - V_{f2} = V_r + (V_{be} - V_{f2}) \tag{22}$$

Because $V_{o2}$ is equal to or higher than 0 V, $$V_r = V_{o2} - (V_{be} - V_{f2}) \leq 0 \tag{23}$$

It is necessary to set $V_r$ which is the limiter voltage in a range satisfying the equation (23).

Figure 11:
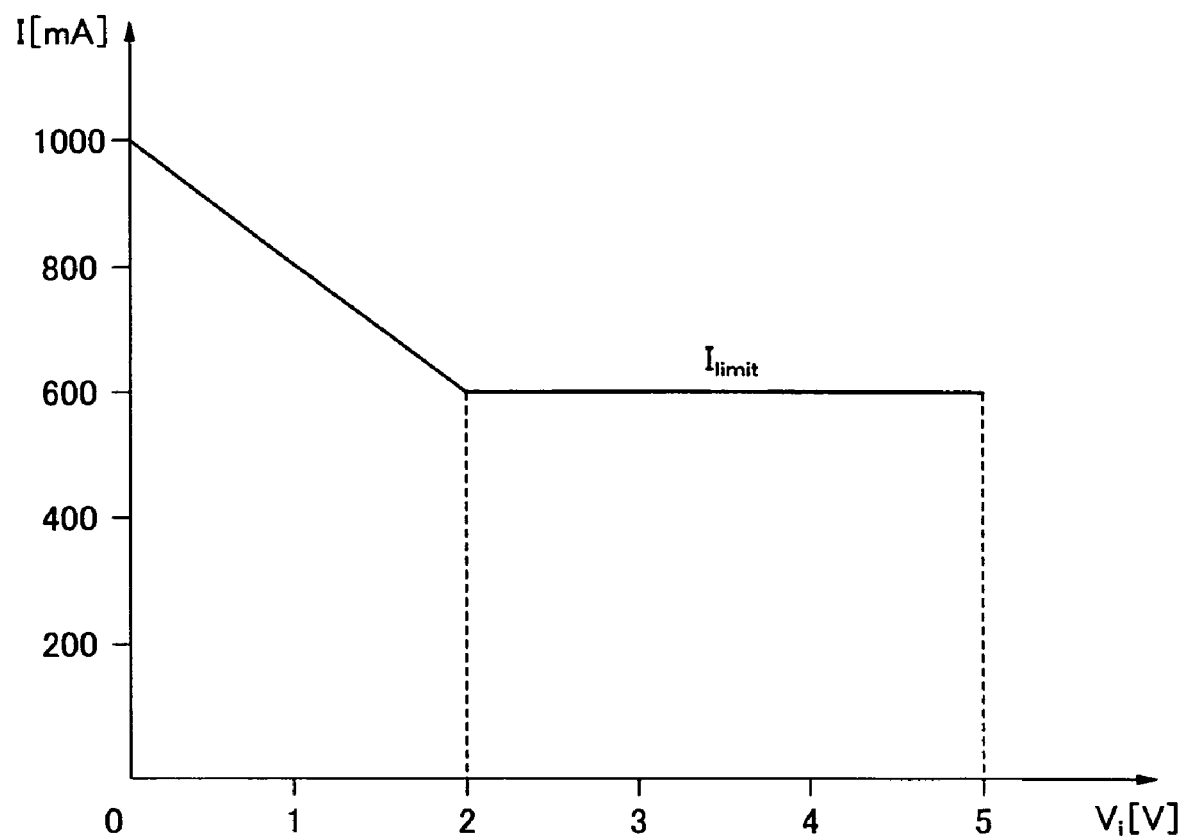
FIG. 11 is a graph showing a characteristic of a circuit shown in FIG. 10.

A relationship between $V_i$ and the output current I of the current control circuit with limiter according to the seventh exemplary embodiment is obtained as shown in FIG. 11.

As described above, according to this exemplary embodiment, the current control circuit with limiter can be realized by the simple structure including only two Op-Amps and one PNP transistor. The circuit according to this exemplary embodiment can limit the minimum value of the output current. That is, the circuit can ensure the output current equal to or larger than the predetermined value without depending on the input voltage. The circuit has the advantage that there is no temperature dependence.

The current control circuit with limiter according to the seventh exemplary embodiment is also a current control circuit with limiter, of a type for drawing out a current from a load.

8. Eighth Exemplary Embodiment

The PNP transistor in the seventh exemplary embodiment may be a p-channel field effect transistor.

Figure 12:
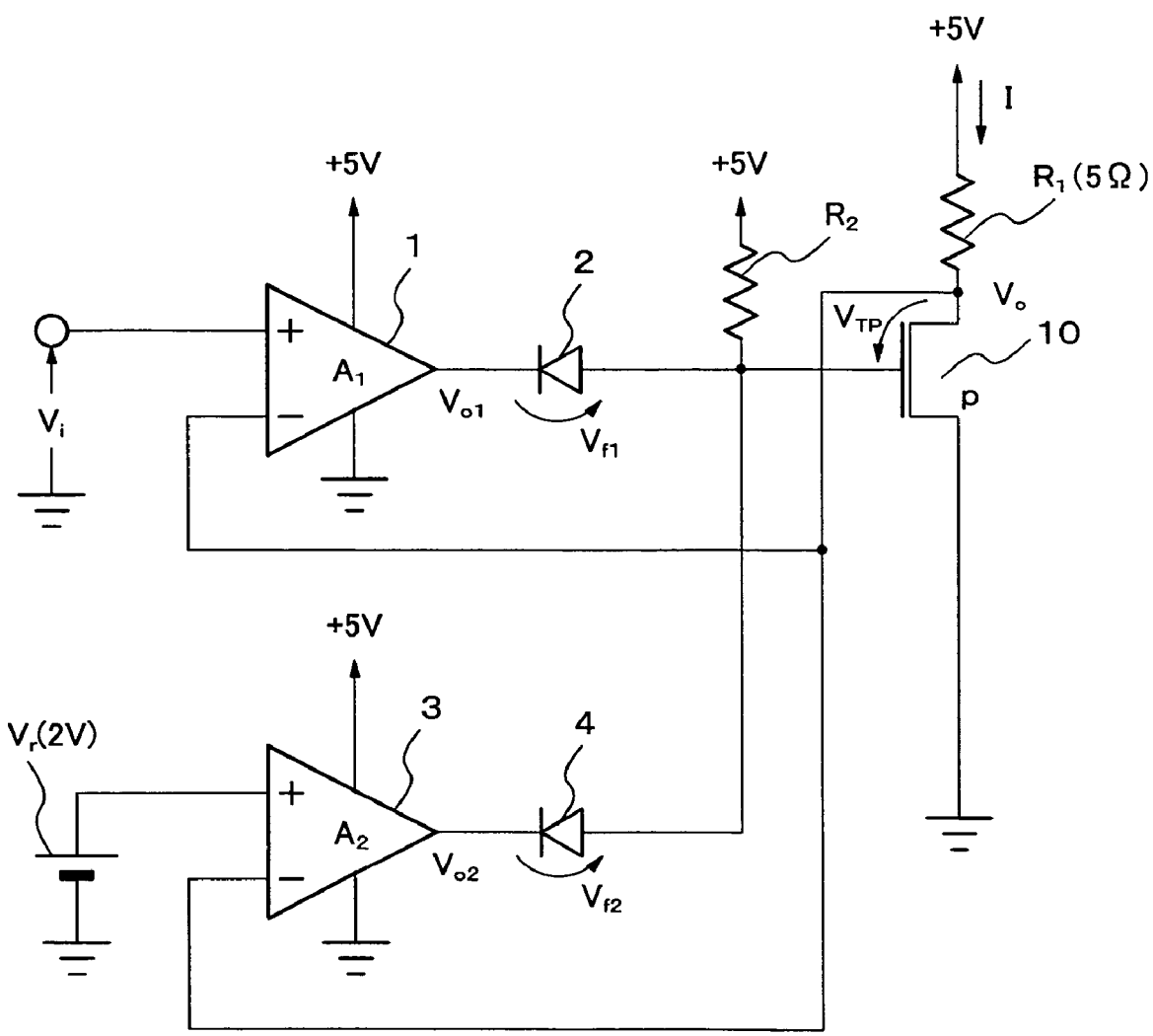
FIG. 12 is a circuit diagram showing an eighth exemplary embodiment of the present invention.

FIG. 12 is a circuit diagram showing an eighth exemplary embodiment of the present invention. The PNP transistor 5 is replaced by the p-channel field effect transistor 10.

Other circuit structures and circuit operations are identical to those in the seventh embodiment and thus the descriptions thereof are omitted here.

A relationship between $V_i$ and the output current I of the current control circuit with limiter according to the eighth exemplary embodiment is also obtained as shown in FIG. 11.

As described above, according to this exemplary embodiment, the current control circuit with limiter can be realized by the simple structure including only two Op-Amps and one p-channel field effect transistor. The circuit according to this embodiment can limit the minimum value of the output current. That is, the circuit can ensure the output current equal to or larger than the predetermined value without depending on the input voltage. The circuit has the advantage that there is no temperature dependence.

The current control circuit with limiter according to the eighth exemplary embodiment is a current control circuit with limiter, of a type for drawing out a current from a load.

9. Ninth Exemplary Embodiment

The current control circuit with limiter according to the present invention can be used for a heater driving circuit or a Peltier device driving circuit, each of which is a circuit for temperature control. Alternatively, the current control circuit with limiter according to the present invention can be used for a laser diode driving circuit, an LCD driving circuit, or an LED driving circuit, each of which is a circuit for light emitting device control or optical attenuator control. The present invention can be widely applied to circuits which require current drive control.

Figure 13:
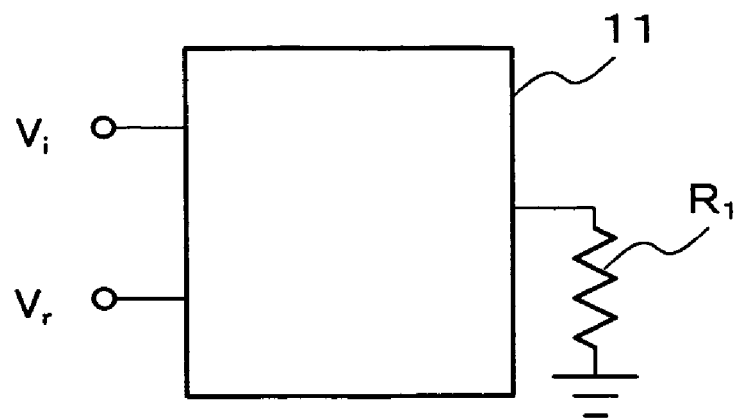
FIG. 13 is a circuit diagram showing a ninth exemplary embodiment of the present invention.

FIG. 13 is a block diagram showing a ninth exemplary embodiment in the case where temperature control is performed using a current control circuit with limiter 11 according to the first exemplary embodiment. In FIG. 13, only the load resistor $R_1$ shown in FIG. 1 is externally provided. However, the entire structure is identical to that in the first exemplary embodiment.

In this exemplary embodiment, a current flowing into the load resistor $R_1$ such as a heater is controlled based on $V_i$ to perform predetermined temperature control. At this time, the reference voltage $V_r$ suitable to limit a heat generation value of the load resistor $R_1$ is inputted so as to prevent an excessive increase in temperature which is caused by the excess of the current flowing into the load resistor $R_1$.

As described above, the temperature control circuit according to this exemplary embodiment can control the heat generation value of the heater based on the input voltage and limit the heat generation value so as to prevent the heat generation value from becoming equal to or higher than a predetermined value.

Instead of the heater, a cooling device such as a Peltier device may be used. Any temperature control device capable of controlling a heat generation value or a heat absorption value based on a voltage can be used for the load resistor $R_1$.

The above-mentioned temperature control can be performed using not only the current control circuit with limiter according to the first embodiment but also the current control circuit with limiter according to each of the second, third, and fourth exemplary embodiments.

When the current control circuit with limiter according to each of the fifth to eighth exemplary embodiments is used, the minimum value of the current flowing into the temperature control device can be limited.

10. Tenth Exemplary Embodiment

Figure 14:
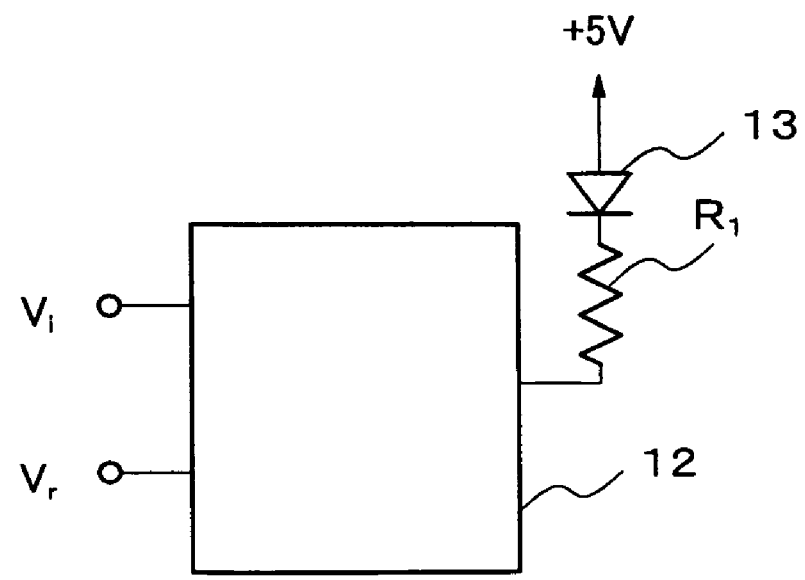
FIG. 14 is a circuit diagram showing a tenth exemplary embodiment of the present invention.
Figure 15:
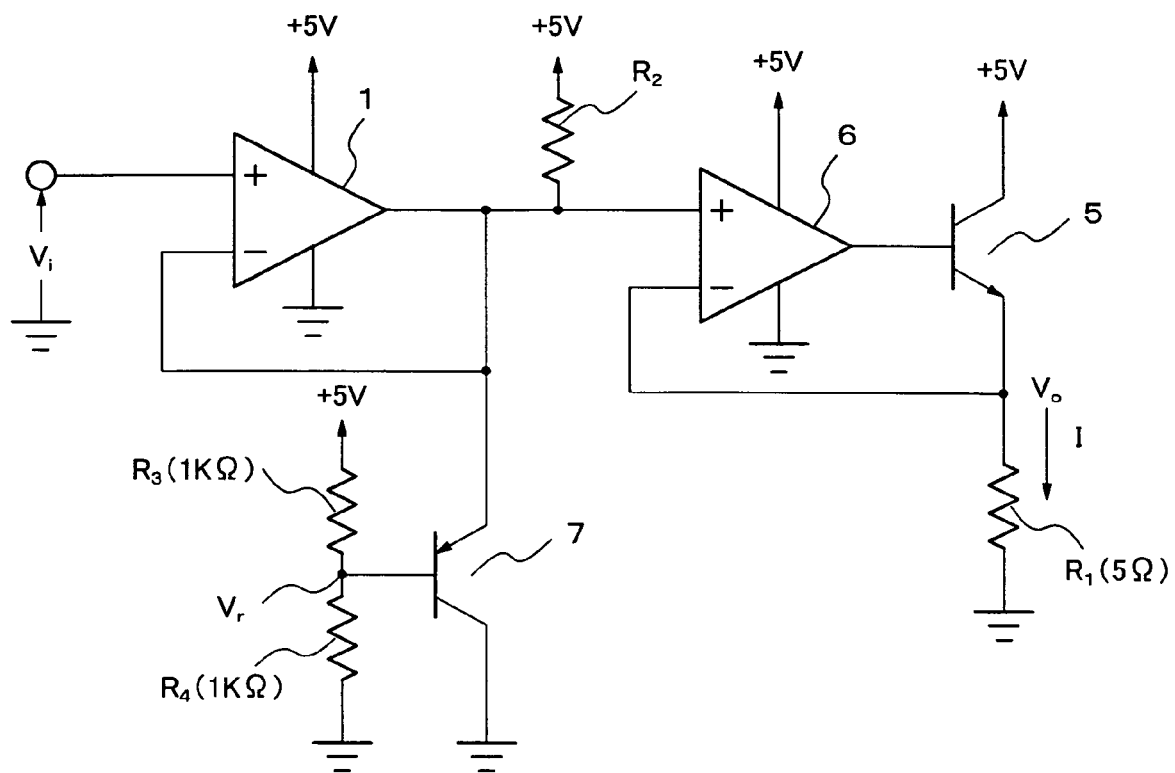
FIG. 15 is a circuit diagram showing a conventional example of a current control circuit with limiter.
Figure 16:
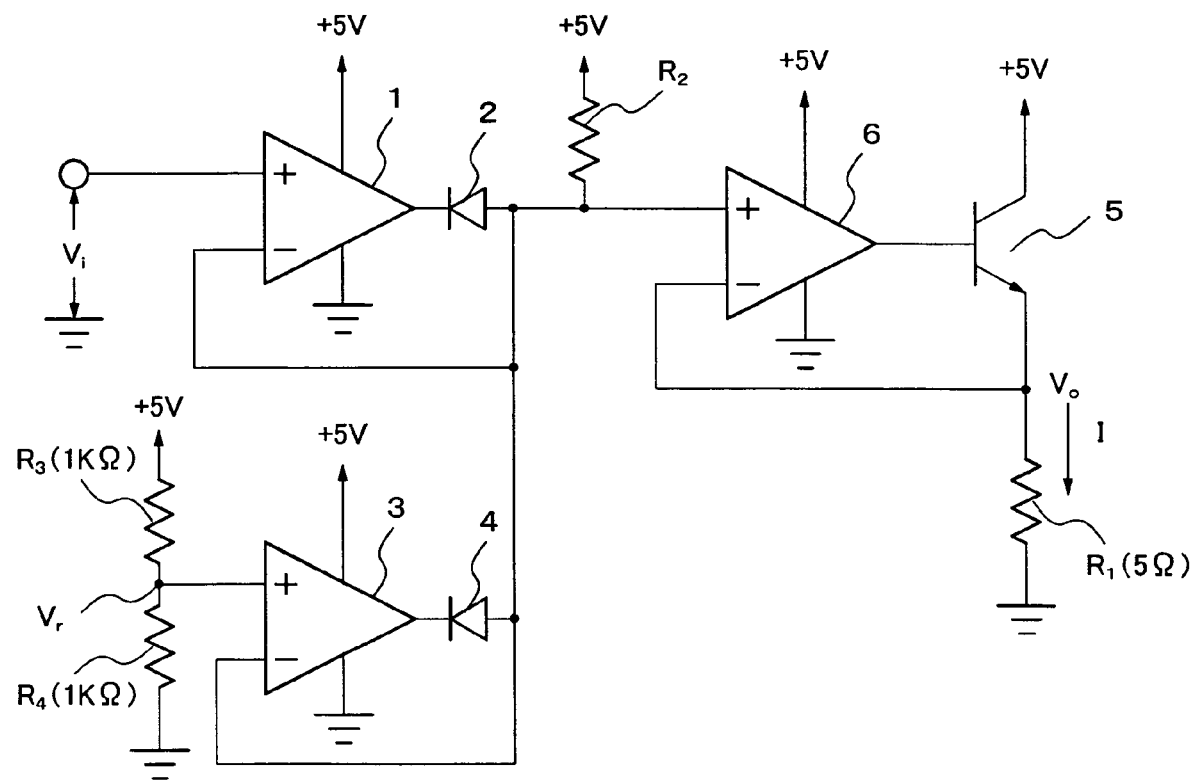
FIG. 16 is a circuit diagram showing another conventional example of a current control circuit with limiter.

FIG. 14 is a block diagram showing a tenth exemplary embodiment in the case where a light emitting device is controlled using a current control circuit with limiter 12 according to the eighth exemplary embodiment. In FIG. 14, only the load resistor $R_1$ shown in FIG. 12 is externally provided. However, the structure including the load resistor $R_1$ is identical to that in the eighth exemplary embodiment.

In this exemplary embodiment, a current flowing into an LED 13 is controlled based on $V_i$ to control light emission brightness of the light emitting device. At this time, a minimum value of the current flowing into the LED 13 is set and the suitable reference voltage $V_r$ is inputted so as to prevent an excessive reduction in brightness. In the tenth exemplary embodiment, the brightness can be controlled in a range in which $V_i$ is smaller than $V_r$, and the output current I becomes $(5-V_i-V_{f3})/R_1$. Here, $V_{f3}$ denotes a forward voltage of the LED 13.

When $V_i$ is equal to or larger than $V_r$, the output current I becomes $(5-V_r-V_{f3})/R_1$, so that it becomes constant without depending on $V_i$.

As described above, a brightness control circuit for the light emitting device according to the present invention can control the current flowing into the light emitting device based on the input voltage and limit the current so as to prevent the current from becoming equal to or lower than a predetermined value.

The usable light emitting device may naturally be any light emitting device which can be driven by a direct current voltage, in addition to the LED.

The above-mentioned brightness control can be performed using not only the current control circuit with limiter according to the tenth embodiment but also the current control circuit with limiter according to each of the fifth to seventh embodiments.

When the current control circuit with limiter according to each of the first to fourth exemplary embodiments is used, the maximum value of the current flowing into the temperature control device can be limited.

While this invention has been described in connection with certain exemplary embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

Further, it is the inventor's intent to retain all equivalents of the claimed invention even if the claims are amended during prosecution.

This application is based on Japanese Patent Application No. 2005-46348 filed on Feb. 23, 2005, and including specification, claims, drawings and summary. The disclosure of the above Japanese Patent Application is incorporated herein by reference in its entirety.

What is claimed is:

1. A current control circuit with limiter, comprising:
    a voltage follower which is an output unit of the current control circuit, said voltage follower including a transistor;
    a first operational amplifier including a non-inverting input which receives an input voltage to the current control circuit, and an inverting input which receives an output of the voltage follower;
    a second operational amplifier including a non-inverting input which receives a predetermined voltage, and an inverting input which receives the output of the voltage follower;
    a first diode connected between an output of the first operational amplifier and an input of the voltage follower; and
    a second diode connected between an output of the second operational amplifier and the input of the voltage follower.

2. The current control circuit with limiter according to claim 1, wherein:
    the transistor comprises an NPN bipolar transistor;
    the voltage follower comprises input connected with a base of the transistor, and an output connected with an emitter thereof;
    the first diode includes a cathode connected with the output of the first operational amplifier, and an anode connected with the base of the transistor; and the second diode includes a cathode connected with the output of the second operational amplifier, and an anode which is connected with the base of the transistor.

3. The current control circuit with limiter according to claim 2, wherein a forward voltage of each of the first diode and the second diode is higher than a voltage from the emitter to the base.

4. The current control circuit with limiter according to claim 1, wherein:
the transistor comprises an n-channel field effect transistor;
the voltage follower comprises an input connected with a gate of the transistor, and the output connected with a source thereof;
the first diode includes a cathode connected with the output of the first operational amplifier, and an anode connected with the gate of the transistor; and
the second diode includes a cathode connected with the output of the second operational amplifier, and an anode connected with the gate of the transistor.

5. The current control circuit with limiter according to claim 4, wherein a forward voltage of each of the first diode and the second diode is higher than a threshold voltage of the transistor.

6. The current control circuit with limiter according to claim 1, wherein:
the transistor comprises a PNP bipolar transistor;
the voltage follower comprises an input connected with a base of the transistor, and the output connected with an emitter thereof;
the first diode includes an anode connected with the output of the first operational amplifier, and a cathode connected with the base of the transistor; and
the second diode includes an anode connected with the output of the second operational amplifier, and a cathode is connected with the base of the transistor.

7. The current control circuit with limiter according to claim 2, wherein a forward voltage of each of the first diode and the second diode is lower than an absolute value of a voltage from the emitter to the base.

8. The current control circuit with limiter according to claim 1, wherein:
the transistor comprises a p-channel field effect transistor;
the voltage follower comprises an input connected with a gate of the transistor, and the output connected with a source thereof;
the first diode includes an anode connected with the output of the first operational amplifier, and a cathode connected with the gate of the transistor; and
the second diode includes an anode connected with the output of the second operational amplifier and a cathode connected with the gate of the transistor.

9. The current control circuit with limiter according to claim 8, wherein a forward voltage of each of the first diode and the second diode is lower than an absolute value of a threshold voltage of the transistor.

10. The current control circuit with limiter according to claim 1, wherein:
the transistor comprises an NPN bipolar transistor;
the voltage follower comprises an input connected with a base of the transistor, and the output connected with an emitter thereof;
the first diode includes an anode connected with the output of the first operational amplifier, and a cathode connected with the base of the transistor; and
the second diode includes an anode connected with the output of the second operational amplifier, and a cathode connected with the base of the transistor.

11. The current control circuit with limiter according to claim 10, wherein a forward voltage of each of the first diode and the second diode is higher than a voltage from the emitter to the base.

12. The current control circuit with limiter according to claim 1, wherein:
the transistor comprises an n-channel field effect transistor;
the voltage follower comprises an input connected with a gate of the transistor, and the output connected with a source thereof;
the first diode includes an anode connected with the output of the first operational amplifier, and a cathode connected with the gate of the transistor; and
the second diode includes an anode is connected with the output terminal of the second operational amplifier, and a cathode connected with the gate of the transistor.

13. The current control circuit with limiter according to claim 12, wherein a forward voltage of each of the first diode and the second diode is higher than a threshold voltage of the transistor.

14. The current control circuit with limiter according to claim 1, wherein:
the transistor comprises a PNP bipolar transistor;
the voltage follower comprises an input connected with a base of the transistor, and the output connected with an emitter thereof;
the first diode includes a cathode connected with the output of the first operational amplifier, and an anode connected with the base of the transistor; and
the second diode includes a cathode connected with the output of the second operational amplifier, and an anode connected with the base of the transistor.

15. The current control circuit with limiter according to claim 14, wherein a forward voltage of each of the first diode and the second diode is lower than an absolute value of a voltage from the emitter to the base.

16. The current control circuit with limiter according to claim 1, wherein:
the transistor comprises a p-channel field effect transistor;
the voltage follower comprises an input connected with a gate of the transistor, and the output connected with a source thereof;
the first diode includes a cathode connected with the output of the first operational amplifier, and an anode connected with the gate of the transistor; and
the second diode includes a cathode connected with the output of the second operational amplifier, and an anode connected with the gate of the transistor.

17. The current control circuit with limiter according to claim 16, wherein a forward voltage of each of the first diode and the second diode is lower than an absolute value of a threshold voltage of the transistor.

18. A temperature control circuit, comprising:
a voltage follower which is an output unit of the temperature control circuit, said voltage follower including a transistor;
a first operational amplifier including a non-inverting input which receives an input voltage to the temperature control circuit, and an inverting input which receives an output of the voltage follower;
a second operational amplifier including a non-inverting input which receives a predetermined voltage, and an inverting input which receives the output of the voltage follower;
a first diode connected between an output of the first operational amplifier and an input of the voltage follower;

a second diode connected between an output of the second operational amplifier and an input of the voltage follower; and a temperature control device which is an output load of the temperature control circuit.

19. A brightness control circuit, comprising:

a voltage follower which is an output unit of the brightness control circuit, said voltage follower including a transistor a first operational amplifier including an non-inverting input which receives an input voltage to the brightness control circuit, and an inverting input which receives an output of the voltage follower;

a second operational amplifier including an non-inverting input which receives a predetermined voltage, and an inverting input which receives the output of the voltage follower;

a first diode connected between an output of the first operational amplifier and an input of the voltage follower;

a second diode connected between an output of the second operational amplifier and an input of the voltage follower; and a light emitting device which is an output load of the brightness control circuit.

* * * * *